United States Patent
Lam et al.

(10) Patent No.: US 7,944,265 B2
(45) Date of Patent: May 17, 2011

(54) CLOCK GENERATOR, METHOD FOR GENERATING CLOCK SIGNAL AND FRACTIONAL PHASE LOCK LOOP THEREOF

(75) Inventors: Christopher Tin Sing Lam, Hsinchu Hsien (TW); Fu Cheng Wang, Hsinchu Hsien (TW); Shou Fang Chen, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 13 days.

(21) Appl. No.: 12/046,527

(22) Filed: Mar. 12, 2008

(65) Prior Publication Data

US 2008/0238498 A1    Oct. 2, 2008

Related U.S. Application Data

(60) Provisional application No. 60/908,189, filed on Mar. 27, 2007.

(51) Int. Cl.
*G06F 1/04* (2006.01)
*H03K 3/00* (2006.01)

(52) U.S. Cl. ......... 327/291; 327/147; 327/156; 327/295

(58) Field of Classification Search .................. 327/141, 327/144–163; 331/15–17; 375/373–376
See application file for complete search history.

(56) References Cited

U.S. PATENT DOCUMENTS

| | | | |
|---|---|---|---|
| 5,825,253 A * | 10/1998 | Mathe et al. | 331/18 |
| 6,559,698 B1 * | 5/2003 | Miyabe | 327/157 |
| 6,703,901 B2 * | 3/2004 | Jovenin et al. | 331/1 A |
| 6,714,084 B2 | 3/2004 | Smith | |
| 7,098,754 B2 * | 8/2006 | Humphreys et al. | 332/103 |
| 7,171,183 B2 | 1/2007 | Chien et al. | |
| 2003/0174026 A1 * | 9/2003 | Adachi et al. | 332/117 |
| 2006/0181446 A1 * | 8/2006 | Yu | 341/143 |
| 2007/0040940 A1 * | 2/2007 | Wang et al. | 348/536 |
| 2007/0164828 A1 * | 7/2007 | Uozumi et al. | 331/16 |
| 2008/0265958 A1 * | 10/2008 | Beaulaton et al. | 327/156 |

FOREIGN PATENT DOCUMENTS

CN    1465029 A    12/2003

OTHER PUBLICATIONS

Office Action issued in counterpart Chinese Application No. 2008100827095 on Feb. 12, 2010 and its English language translation.

* cited by examiner

*Primary Examiner* — Lincoln Donovan
*Assistant Examiner* — Brandon S Cole
(74) *Attorney, Agent, or Firm* — Connolly Bove Lodge & Hutz LLP

(57) ABSTRACT

A clock generator includes a delta sigma modulator, a counter and a first phase lock loop. The delta sigma modulator sequentially generates a plurality of variable parameters according to a predetermined value and a first input clock signal. The counter, which is connected to the delta sigma modulator, is used to generate an output clock signal in accordance with a counting value and a second input clock signal. The counting value is relevant to the variable parameters. The first phase lock loop, which is connected to the output of the counter, is used to generate an objective clock signal in accordance with the output clock signal.

9 Claims, 9 Drawing Sheets

CLOCK GENERATOR, METHOD FOR GENERATING CLOCK SIGNAL AND FRACTIONAL PHASE LOCK LOOP THEREOF

BACKGROUND OF THE INVENTION

1. Field of the Invention

The present invention relates to a clock generating circuit, and more particularly to a fractional phase lock loop having an integral phase lock loop inside, wherein the feedback loop of the integral phase lock loop has a fixed frequency-dividing parameter.

2. Description of the Related Art

Because the fractional phase lock loop exhibits flexibility in selecting reference frequency, bandwidth and channel step size, it has been widely used in the transceiver of the Radio Frequency (RF) components.

FIG. 1 shows a prior art fractional phase lock loop 10, where a reference frequency $F_{ref}$, a fixed frequency, e.g., 24 MHz, is generated by a crystal 14. A voltage-controlled oscillator (VCO) 12 has an output frequency $F_{vco} = N_{div} \times F_{ref}$, where $N_{div}$ is the counting value of an N counter 13. The counting value $N_{div}$ is an integer and controlled under the delta sigma modulator (DSM) 15. During a certain period, the counting value $N_{div}$ varies within a certain numerical range. Over time, the average of the counting value $N_{div}$ will approximate to a non-integral value $N.f_{div}$, where N is an integral part, and $f_{div}$ is a decimal part. For example, as shown in FIG. 1, the integral and decimal parts can be controlled by inputting digital signals with 6 bits plus 19 bits into the delta sigma modulator 15. Therefore the output frequency $F_{vco} = F_{ref} \times N.f_{div}$ will be affected by the counting value of the N counter 13. The prior art fractional phase lock loop 10 achieves its purpose mainly by modulating $N_{div}$. However, the timing at which the control value outputted by the delta sigma modulator 15 is loaded by the N counter 13 has to be very accurate, and with greater values of the counting value $N_{div}$ is, the frequency of the input signal of the N counter 13 must be accordingly higher. Because the prior art exhibits such characteristic, the requirement for timing must be stricter, and thus causes difficulties in design and increases cost.

A dual-modulus divider as shown in FIG. 2 was proposed to resolve a high frequency problem faced by the N counter 13. The dual-modulus divider 20 uses a prescalar 21 with divider equal to 16 or 17 and a pulse swallow counter 22 to decrease the output frequency $F_{vco}$ so as to obtain a looser loading mechanism for the N counter 13 to load the control value. However, unless the timing is readjusted, other problems such as jitters and phase noises will likely occur.

SUMMARY OF THE INVENTION

The clock generator in accordance with one embodiment of the present invention comprises a delta-sigma modulator, a counter and a first phase lock loop. The delta-sigma modulator is configured to sequentially generate a plurality of variable parameters in accordance with a predetermined value and a first input clock signal. The counter is coupled to the delta-sigma modulator for generating an output clock signal in accordance with a counting value and a second input clock signal, wherein the counting value is in response to the variable parameters. The first phase lock loop is coupled to the output of the counter for generating an objective clock signal in accordance with the output clock signal.

The fractional phase lock loop in accordance with one embodiment of the present invention comprises a fractional frequency divider and an integral phase lock loop. The fractional frequency divider is used for generating an output frequency signal in accordance with a predetermined value and the input clock signal. The integral phase lock loop is coupled to the fractional frequency divider, where the integral phase lock loop has an integral dividing parameter, and generates the objective clock signal in accordance with the output clock signal and the integral frequency-dividing parameter.

The method for generating clock signals in accordance with one embodiment of the present invention comprises the steps of: generating an output clock signal in accordance with the input clock signal and a predetermined value, where the frequency of the input clock signal is a non-integer multiple of an equivalent frequency of the output clock signal; inputting the output clock signal to a phase lock loop so as to generate the objective clock signal by the phase lock loop; where the phase lock loop has an integral frequency-dividing parameter, and the phase lock loop generates the objective clock signal in accordance with the output clock signal and the integral frequency-dividing parameter.

BRIEF DESCRIPTION OF THE DRAWINGS

The invention will be described according to the appended drawings in which.

PREFERRED EMBODIMENT OF THE PRESENT INVENTION

Figure 1:
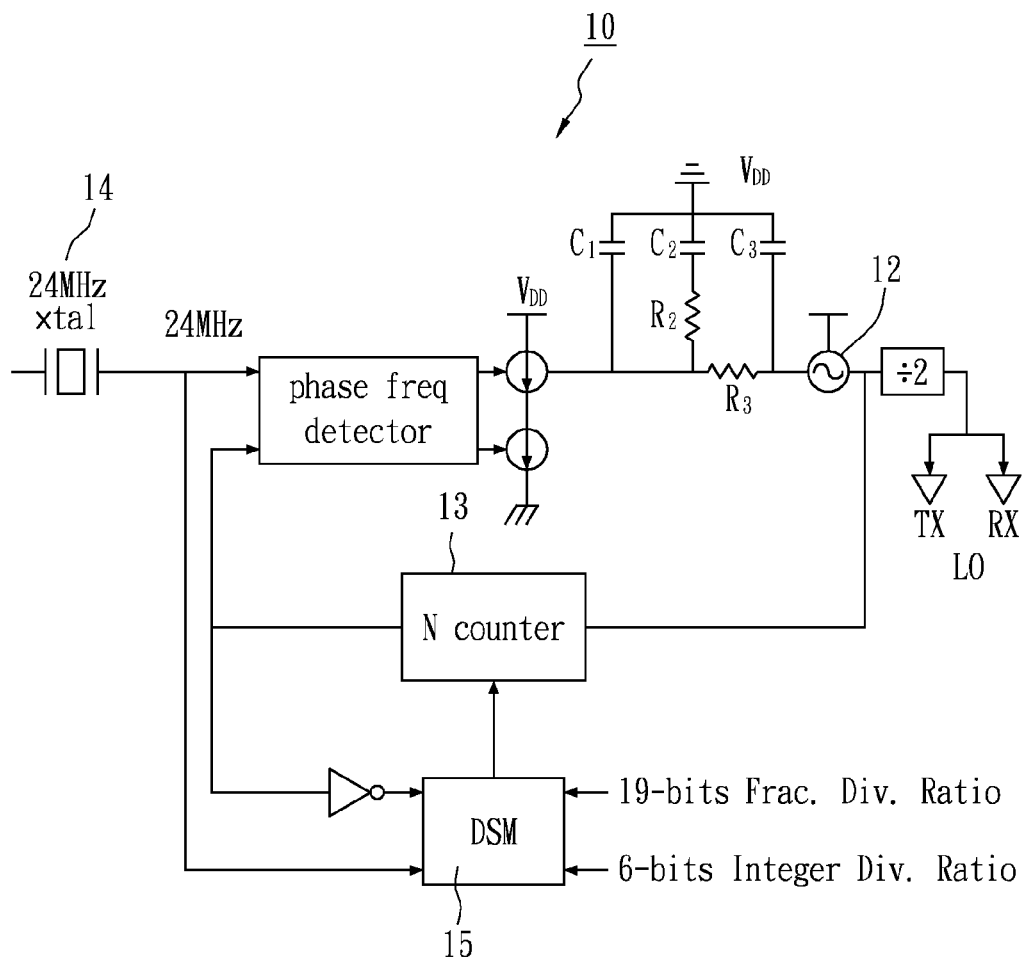
FIG. 1 shows a prior art fractional phase lock loop.
Figure 2:
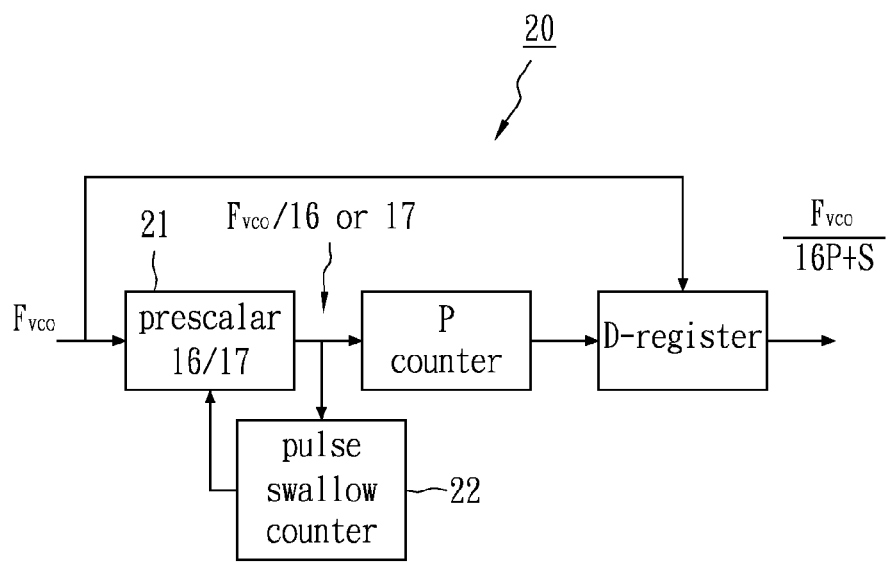
FIG. 2 shows a prior art dual-modulus divider.
Figure 3A:
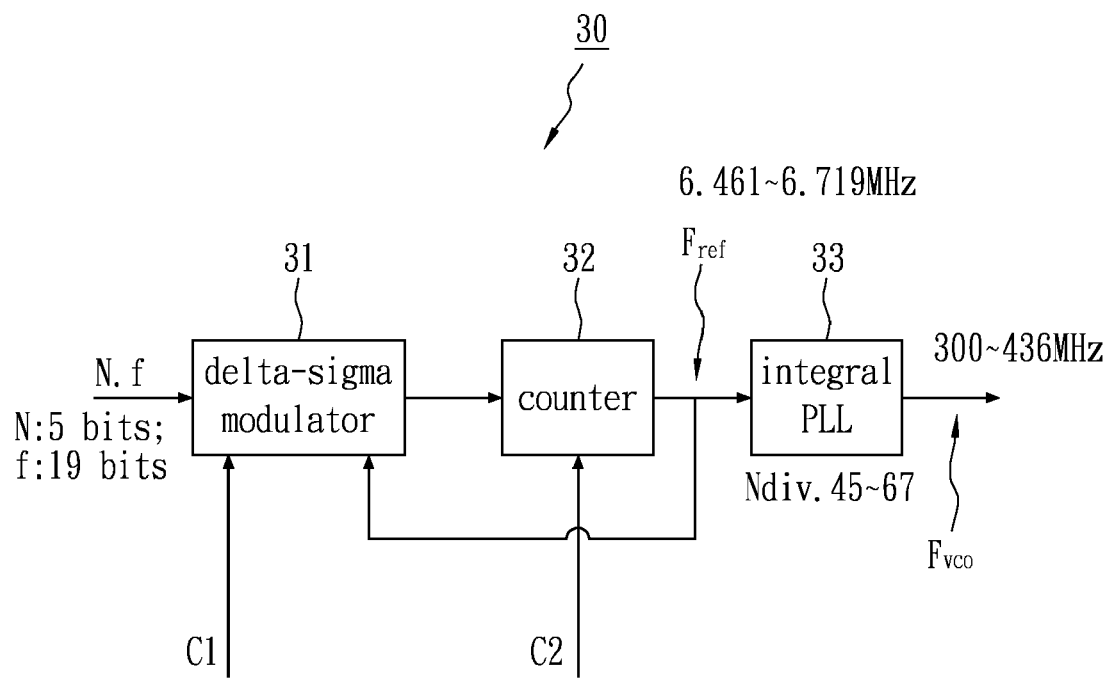
FIG. 3A shows a fractional phase lock loop in accordance with an embodiment of the present invention.

FIG. 3A shows a fractional phase lock loop 30 in accordance with an embodiment of the present invention, which includes a delta-sigma modulator 31, a counter 32 and an integral phase lock loop 33. The input of the delta-sigma modulator 31 receives a predetermined value, which could be a digital signal with multiple bits representing a non-integral value N.f containing an integral part and a decimal part, wherein N represents the integral part and f represents the decimal part. One part of the bits of the digital signal, e.g., the most significant bit (MSB) could be used to represent the integral part, and other bits, e.g., least significant bit (LSB) could be used to represent the decimal part. This embodiment uses five bits to represent the integral part, and nineteen bits to represent the decimal part. Generally, a greater number of bits used to represent the decimal part correspond to greater accuracy of the fraction.

The delta-sigma modulator 31 further receives a clock signal C1. In accordance with the clock signal C1 and the predetermined value, the delta-sigma modulator 31 sequentially generates a plurality of variable parameters, which are digital signals representing an integer respectively located within a certain range in connection with the predetermined value. For example, assuming that the predetermined value is 9.34, then the range may be between 7 and 11. The variable parameter varies within the range, e.g., 8->9->10->11->7->10. Over a long period, the average of the variable parameters will be equal or close to the non-integral value 9.34.

The counter 32 is coupled to the output of the delta-sigma modulator 31, and could be a numerical counter oscillator (NCO) in implementation. Normally, an input clock signal C2 triggers the counting content to increase, and each time the counting content reaches the value corresponding to the current variable parameter which is outputted from the delta-sigma modulator 31, the counter 32 generates an output clock signal $F_{ref}$. The output clock signal $F_{ref}$ is further fed back to the delta-sigma modulator 31. The delta-sigma modulator 31 will not activate the output of the next variable parameter until the output clock signal $F_{ref}$ is received. Subsequently, the counter 32 counts according to a new variable parameter. It should be noted that the input clock signals C1 and C2 could be the same or different, e.g., the frequency of the input clock signal C1 is half that of the input clock signal C2.

Figure 6:
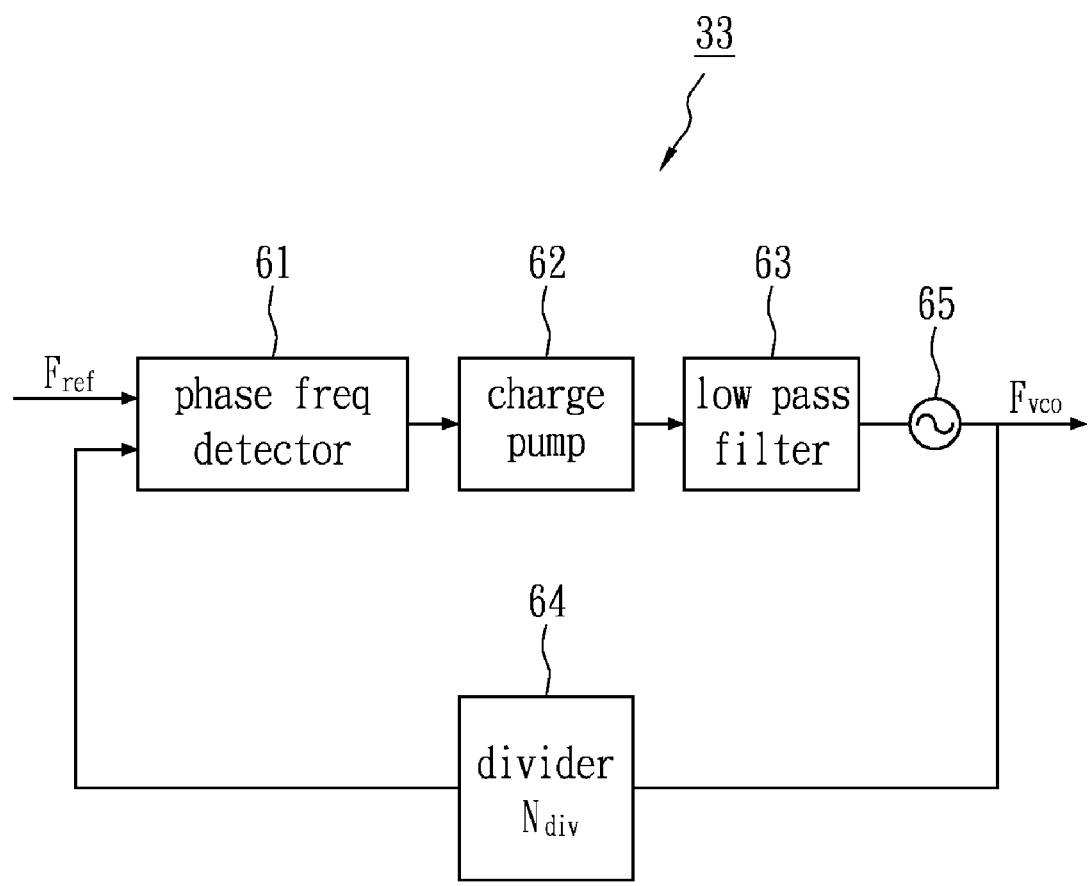
FIG. 6 shows an integral phase lock loop in accordance with one embodiment of the present invention.

The output clock signal $F_{ref}$ of the counter 32 not only feeds back to the delta-sigma modulator 31 but also serves as the input of the integral phase lock loop 33. The integral phase lock loop 33 has an integral frequency-dividing unit, which based on an integral frequency-dividing parameter $N_{div}$ outputs a frequency that is $1/N_{div}$ times that of the input end. Subsequently, in accordance with a variety of applications the objective output clock $F_{VCO}$ of the integral phase lock loop 33 is selectively divided and outputted. According to one embodiment of the present invention, the predetermined value N.f is 25.xxxx, the input clock signal C1 is the same as the input clock signal C2 with a frequency of 168 MHz, and the equivalent frequency of the output clock signal $F_{ref}$ of the counter 32 is between 6.461 and 6.719 MHz. The integral frequency-dividing parameter $N_{div}$ is set between 45 and 67 and thus the objective clock signal $F_{VCO}$ outputted from the integral phase lock loop 33 is between 300 and 436 MHz. Although there is a loop inside the integral phase lock loop 33, as shown in FIG. 6, the internal loop does not feed back to the delta-sigma modulator 31 or the counter 32. Therefore the signals of the present invention remain stable, and do not require strict timing as needed in prior arts.

Figure 3B:
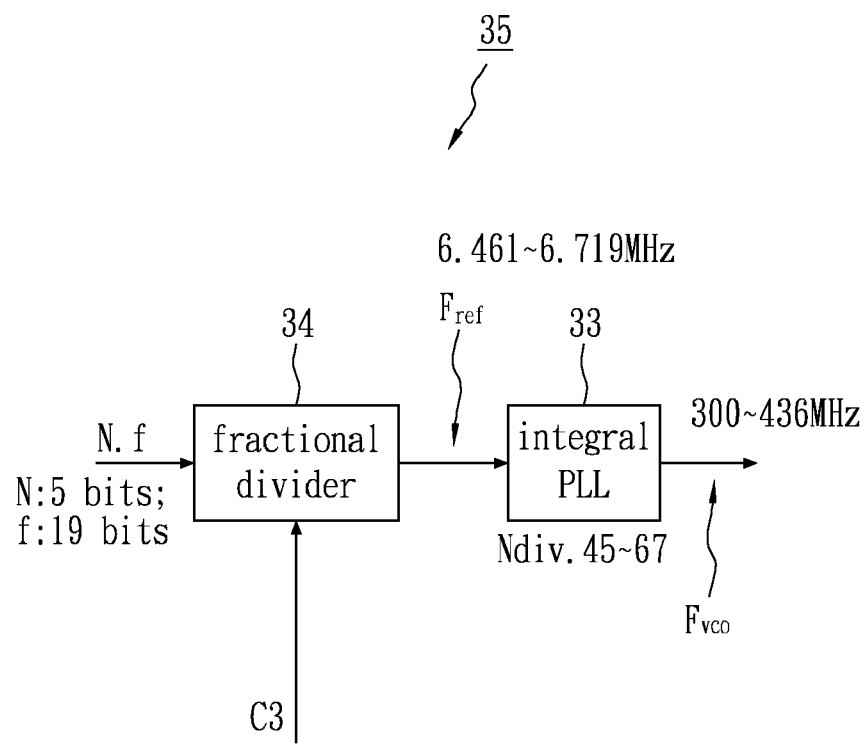
FIG. 3B shows a fractional phase lock loop in accordance with another embodiment of the present invention.

FIG. 3B shows a fractional phase lock loop in accordance with another embodiment of the present invention. The fractional phase lock loop 35 includes a fractional frequency divider 34 and an integral frequency divider 33. The fractional frequency divider 34 generates an output clock signal $F_{ref}$ in accordance with an input clock signal C3 and a predetermined value representing a non-integral value N.f (where N is the integral part, and f is the decimal part). The predetermined value could be a digital signal containing multiple bits, wherein some bits of the digital signal represent the integral part, and other bits of the digital signal represent the decimal part. The fractional frequency divider 34 sequentially generates a plurality of variable parameters, which represent integers individually, in accordance with the predetermined value. The fractional frequency divider 34 sequentially divides the input clock signal C3 by the variable parameters. Over a period of time, the average of the multiple variable parameters will approximate the non-integral value N.f. In other words, this effect is the same as that of the fractional frequency divider 34, which divides the input clock signal C3 by the non-integral value N.f so as to generate the output clock signal $F_{ref}$. Therefore, the frequency of the input clock signal C3 will be equal or close to the product of the equivalent frequency of the output clock signal $F_{ref}$ and the non-integral value.

The integral phase lock loop 33 could be a regular one commonly used in prior art, whose input end is coupled to the fractional frequency divider 34. That is, the integral phase lock loop 33 takes the output clock signal $F_{ref}$ of the fractional frequency divider 34 as the reference clock signal thereof. The integral phase lock loop 33 has a fixed integral frequency-dividing factor $N_{div}$ so that the frequency of the generated objective clock signal $F_{VCO}$ is $N_{div}$ times that of the output clock signal $F_{ref}$.

Figure 4:
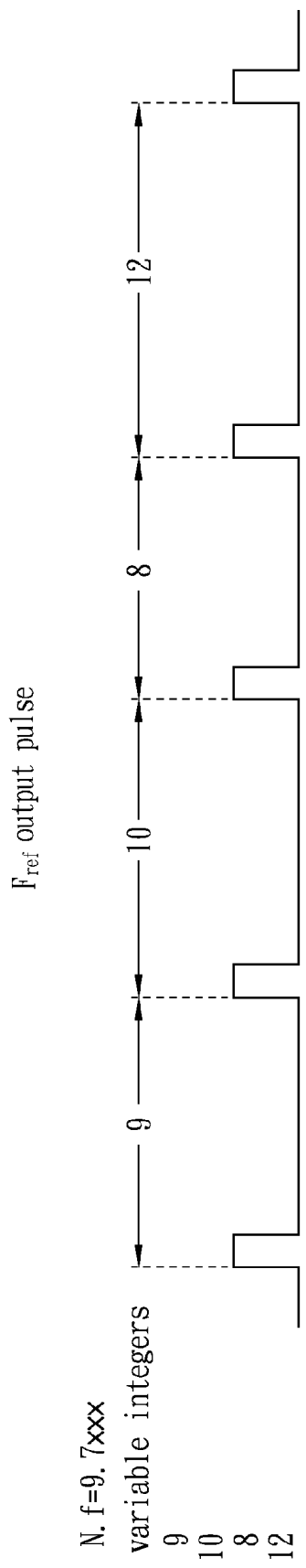
FIG. 4 shows the relationship between the non-integral value N.f, a plurality of variable parameters and output clock signals $F_{ref}$.
Figure 5A:
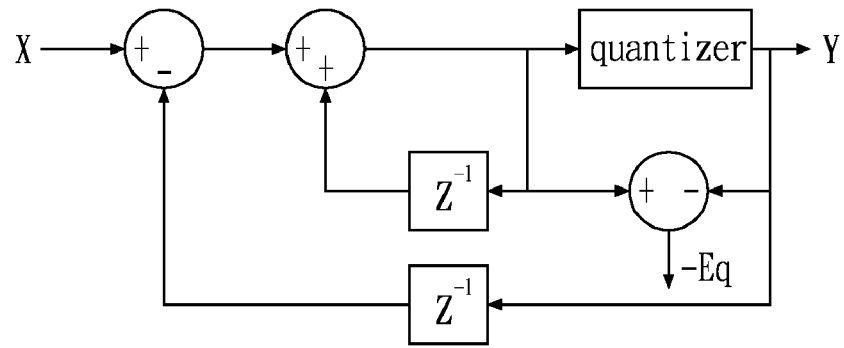
FIG. 5A through 5D respectively show a delta-sigma modulator with a first-order, a second-order single-loop, a third-order MASH 1-1-1 and a third-order MASH 1-2.
Figure 5B:
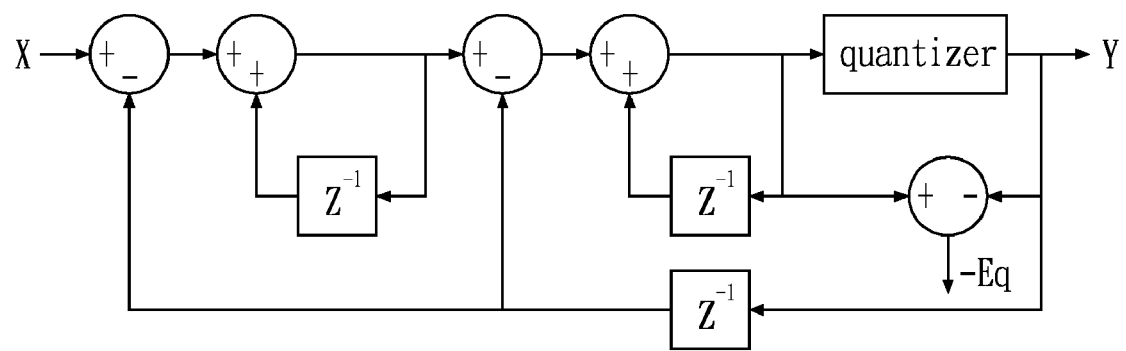
Figure 5C:
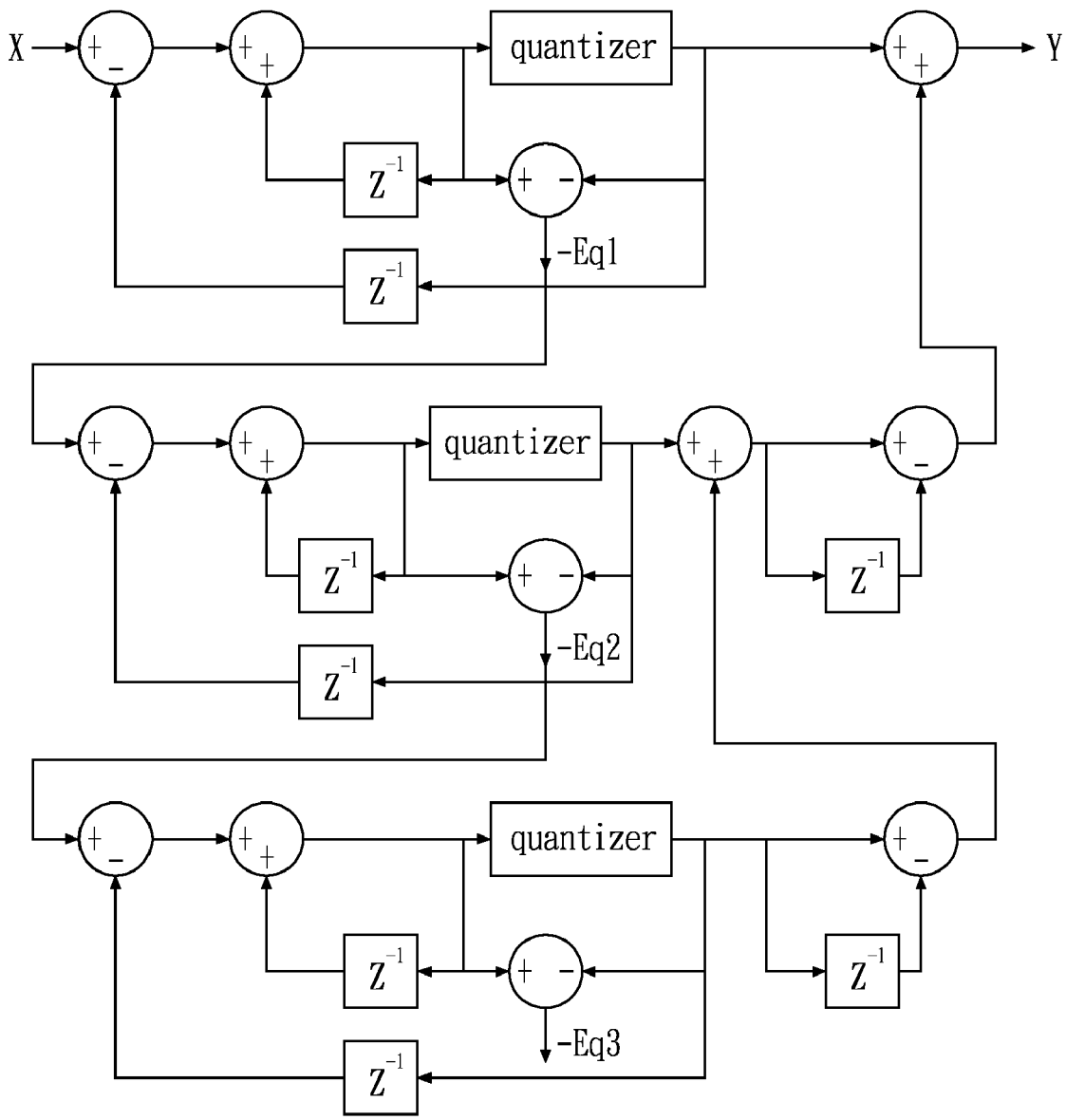
Figure 5D:
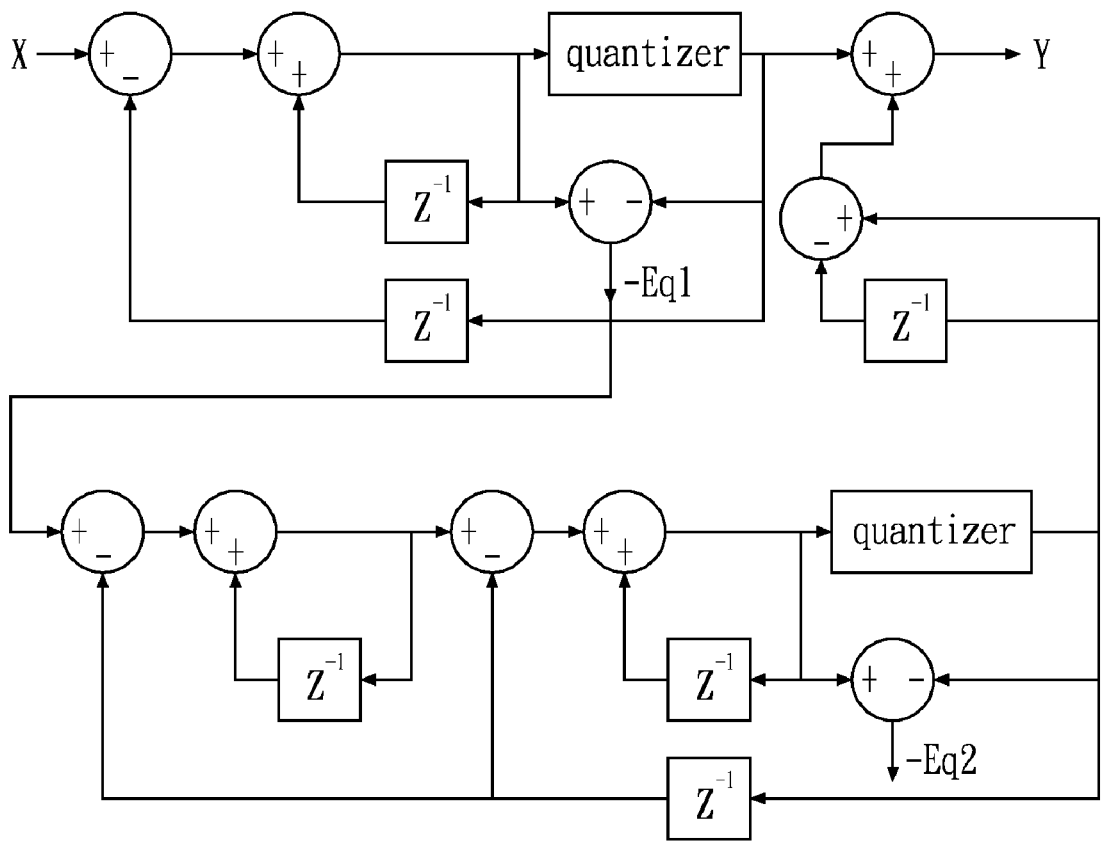

FIG. 4 shows the relationship between the non-integral value N.f, a plurality of variable parameters and the output clock signals $F_{ref}$. Although the plurality of variable parameters continuously change their values within the range set by the delta-sigma modulator 31, based on the order and internal circuit design of the delta-sigma modulator 31, at any given time, the stored value of the counter 32 is one of the plurality of variable parameters. Over a period of time, the average of the plurality of variable parameters will be equal to or close to N.f; therefore the equivalent frequency of the output clock signal $F_{ref}$ of the counter 32 will eventually be in inverse proportion to the predetermined value N.f. In other words, the output clock signal $F_{ref}$ will be the output of dividing the input clock signal C3 by N.f. Assuming that the frequency of the input clock signal C3 is 168 MHz and the predetermined N.f is equal to 9.75 (the combination of the corresponding variable parameters is shown in FIG. 4 as an example), the equivalent frequency of the output clock signal $F_{ref}$ of the counter 32 is illustrated as equation (1):

$$F_{ref} = \frac{168 \text{ MHz}}{9.75} \quad (1)$$

The delta-sigma modulator 31 of this embodiment can use a normal one or be determined by a special design. For example, FIG. 5A through 5D respectively show a delta-sigma modulator with a first-order, a second-order single-loop, a third-order MASH 1-1-1 and a third-order MASH 1-2. Generally, the drawback of the first-order delta-sigma modulator is periodicity. Higher degrees of the delta-sigma modulator will correspondingly have greater randomization, so the characteristic of the periodicity can be overcome and the requirement of accuracy can be achieved. However, at this time another drawback of dramatic variation in periodicity occurs. For example, the period of the first-order delta-sigma modulator may be 5 or 6, but the period of the fifth-order delta-sigma modulator may be between 2 and 18; thus a new problem with respect to phase jitter occurs. As such, in determining what order is needed, the integer N has to be considered. In the case of the present embodiment, the integer N is between 6 and 18, preferably between 11 and 13, and the delta-sigma modulator 31 selects between the second and fourth order, preferably the third order.

FIG. 6 shows an integral phase lock loop 33 in accordance with one embodiment of the present invention. The primary path of the integral phase lock loop 33 sequentially includes a phase frequency detector 61, a charge pump 62, a low pass filter 63 and a voltage-controlled oscillator 65. The phase frequency detector 61 is used to detect the phase difference between the output clock signal $F_{ref}$ and the feedback signal generated by the divider 64. The charge pump 62 generates a current in accordance with the phase difference, and then transforms it into a voltage signal, which is further used by the voltage-controlled oscillator 65 to output the objective clock signal $F_{vco}$. The divider 64 situated on the feedback path of the integral phase lock loop 33 is coupled to the other input of the phase frequency detector 61. Because the delta-sigma modulator 31 possesses a noise shaping function, which reshapes the original normal distributed quantization noise into a new formation whose high frequency region has the greatest quantization noise but whose low frequency region has only a little, the present embodiment largely eliminates noise in contrast with the prior art by later going through the low pass filter 63. The difference from the prior art is that the divider $N_{div}$ of the integral phase lock loop 33 is constant, which helps to reach the purpose of the fractional phase lock loop by adjusting the reference signal, i.e., the output clock signal of the counter 32. The objective clock signal $F_{vco}$ of the voltage-controlled oscillator 65 is illustrated as follows:

$$F_{vco} = F_{ref} \times N_{div} = \frac{168 \text{ MHz}}{N \cdot f} \times N_{div} \quad (2)$$

Figure 7A:
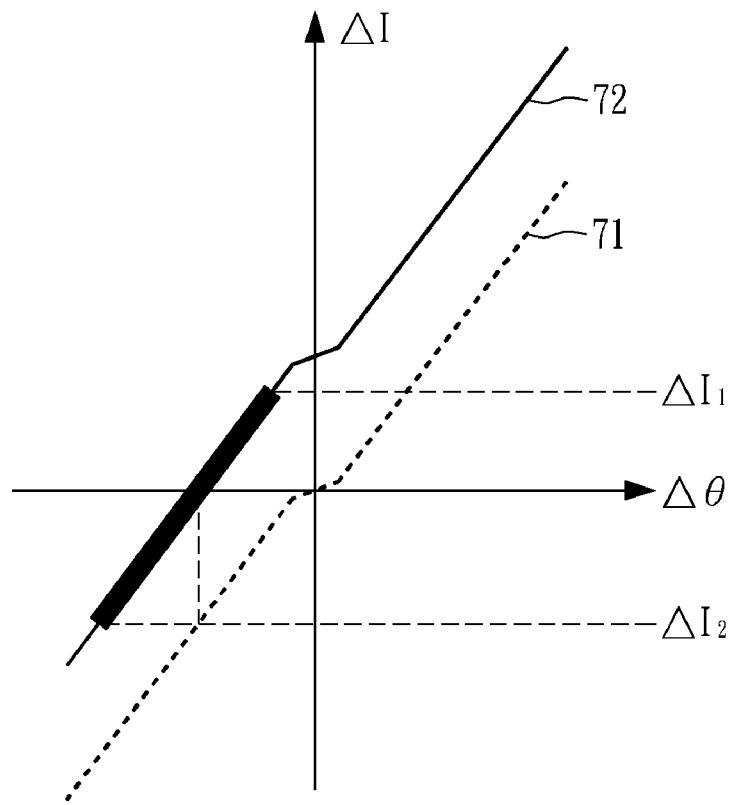
FIG. 7A shows the relation of the phase difference $\Delta\theta$ between two input signals and current increment/decrement $\Delta I$ of the charge pump in accordance with one embodiment of the present invention.
Figure 7B:
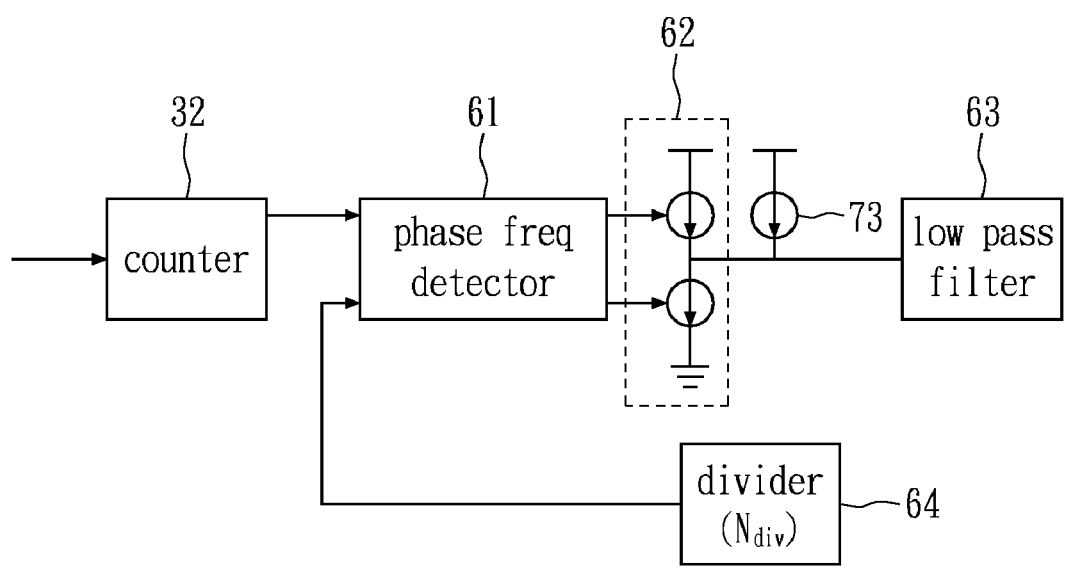
FIG. 7B shows a charge pump in accordance with one embodiment of the present invention.

FIG. 7A shows the relation of the phase difference $\Delta\theta$ between two input signals and current increment/decrement $\Delta I$ of the charge pump in accordance with one embodiment of the present invention. Generally, when the phase difference of the two input signals of the phase frequency detector 61 is equal or close to 0, the integral phase lock loop 33 may not have enough time to make a timely response; thus a non-linear region close to the original point will occur, such as the curve 71 shown in FIG. 7A. In FIG. 7B, because the output frequency of the counter 32 of the present invention is being adjusted, rather than the frequency of the prior art feedback signal that was adjusted in the feedback path, the integral phase lock loop has to operate in a more accurate linear region.

FIG. 7B shows a charge pump in accordance with one embodiment of the present invention. In order to avert from the non-linear region when operating, the charge pump 62 of the present invention can further add a current source 73 to make a DC offset on the curve 72 shown in FIG. 7A. When the present invention operates in the region between $\Delta I_1$ and $\Delta I_2$, the non-linear region can be averted. Although the current source 73 in FIG. 7B is a source current, an alternate option can be a sink current. Using the sink current can also make the operating point avert from the non-linear region to reach the same purpose. According to one embodiment of the present invention, the frequency of the input clock signal of the counter 32 is 150 MHz, the delta-sigma modulator 31 is second-order, and the required phase delay is 14 ns, assuming that the equivalent frequency of the output clock signal $F_{ref}$ is 26 MHz, and the percentage of the offset current is 14 ns/(1/26 MHz)=36.4%.

Figure 8:
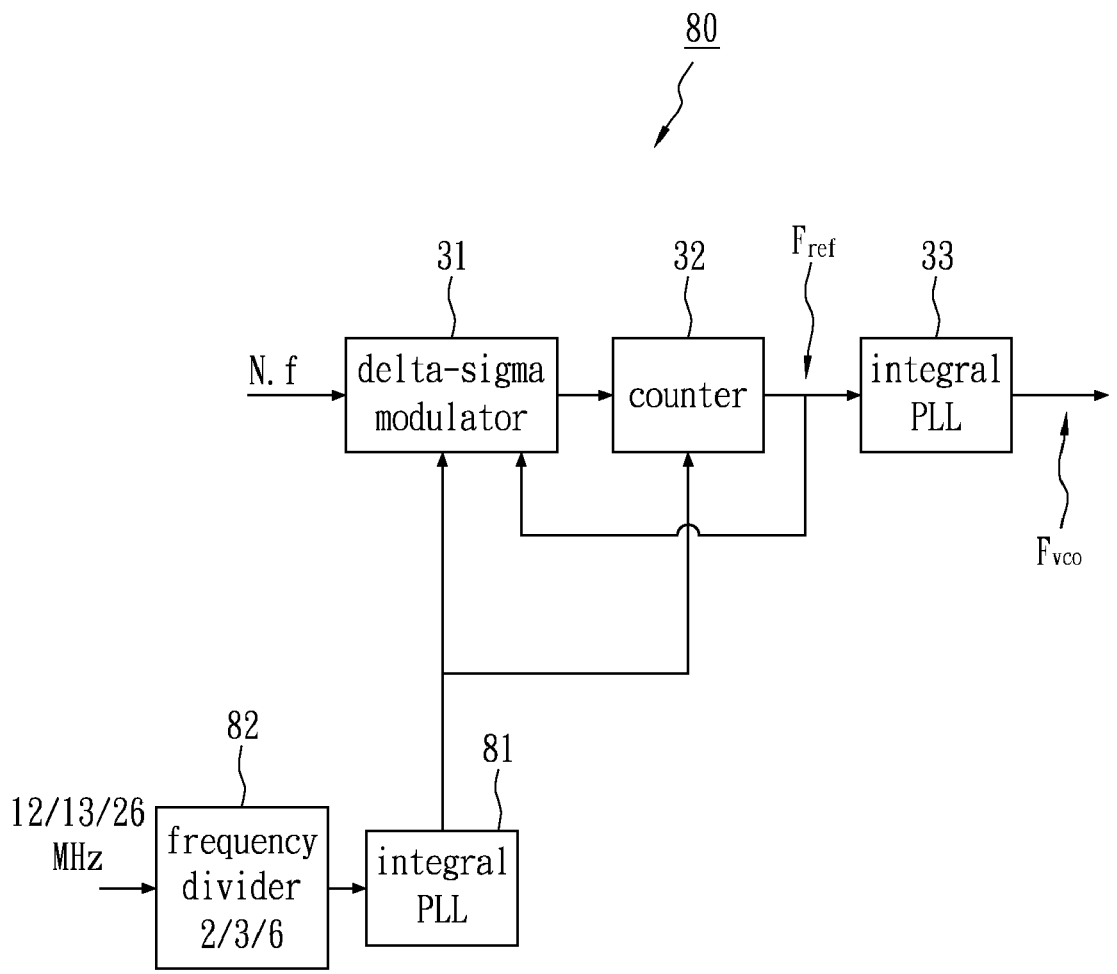
FIG. 8 shows a fractional phase lock loop in accordance with one embodiment of the present invention.

FIG. 8 shows a fractional phase lock loop in accordance with one embodiment of the present invention. The fractional phase lock loop 80 makes a copy of the integral phase lock loop 33 and places it at the input clock end to avoid inputting a high frequency clock signal, such as one above 168 MHz. As shown in FIG. 8, if an integral phase lock loop 81 and a frequency divider 82 (divider 2/3/6) are further added at the input end of the counter 32, the input clock signal can reduce its necessary frequency from 168 MHz to 12/13/26 MHz by adopting suitable parameters so as to reduce cost. Please note that the embodiment only exemplifies a single integral phase lock loop 81 which is commonly shared by the delta-sigma modulator 31 and the counter 32, but in other alternates, the delta-sigma modulator 31 and the counter 32 can be designed to receive different input clock signals.

The above-described embodiments of the present invention are intended to be illustrative only. Numerous alternative embodiments may be devised by persons skilled in the art without departing from the scope of the following claims.

What is claimed is:

1. A clock generator, comprising:
    a delta-sigma modulator configured to sequentially generate a plurality of variable parameters and a counting value according to a predetermined value and a first input clock signal;
    a counter coupled to the delta-sigma modulator for generating an output clock signal according to the counting value and a second input clock signal, wherein the delta-sigma modulator does not reactivate output of the variable parameters until the output clock signal is fed back to the delta-sigma modulator; and
    a phase lock loop coupled to the counter for generating an objective clock signal according to the output clock signal, comprising:
        a charge pump configured to provide a first current with a current level; and
        an additional current source coupled to the charge pump for providing a second current, wherein the current level is affected by the second current for generating a direct current offset such that the clock generator averts from a non-linear region, the objective clock signal is not fed back to the delta-sigma modulator and the counter.

2. The clock generator of claim 1, wherein the delta-sigma modulator further receives the output clock signal, and generates the variable parameters in accordance with the output clock signal.

3. The clock generator of claim 1, wherein the first phase lock loop is an integral phase lock loop having an integral frequency-dividing parameter, and the frequency of the objective clock signal is the product of an equivalent frequency of the output clock signal and the integral frequency-dividing parameter.

4. The clock generator of claim 1, wherein the variable parameter is a digital signal for representing an integral value.

5. The clock generator of claim 1, wherein the average value of the plurality of variable parameters is equal or close to the non-integral value represented by the pre-determined value.

6. The clock generator of claim 1, wherein the first phase lock loop includes an integral frequency-dividing unit for generating a feedback signal required by the first phase lock loop by dividing the frequency of the objective clock signal by an integral value.

7. The clock generator of claim 1, wherein the first input clock signal is different from the second input clock signal.

8. The clock generator of claim 1, wherein the first phase lock loop is in an active manner without generating a feedback signal to the delta-sigma modulator or the counter.

9. The clock generator of claim 1, further comprising a second phase lock loop for generating the first or second input clock signal in accordance with a reference clock signal, wherein the frequency of the reference clock signal is smaller than the frequency of the first or the second clock signal.

* * * * *